(12) United States Patent
Santolaria et al.

(10) Patent No.: US 12,494,409 B2
(45) Date of Patent: Dec. 9, 2025

(54) POWER SEMICONDUCTOR COMPONENT

(71) Applicant: Hitachi Energy Ltd, Zürich (CH)

(72) Inventors: Lluis Santolaria, Olten (CH); Samuel Hartmann, Staufen (CH); Milad Maleki, Untersiggenthal (CH); Dominik Truessel, Bremgarten (CH); Harald Beyer, Lenzburg (CH)

(73) Assignee: HITACHI ENERGY LTD, Zürich (CH)

( * ) Notice: Subject to any disclaimer, the term of this patent is extended or adjusted under 35 U.S.C. 154(b) by 385 days.

(21) Appl. No.: 18/038,545

(22) PCT Filed: Nov. 24, 2021

(86) PCT No.: PCT/EP2021/082840
§ 371 (c)(1),
(2) Date: May 24, 2023

(87) PCT Pub. No.: WO2022/112339
PCT Pub. Date: Jun. 2, 2022

(65) Prior Publication Data
US 2024/0096746 A1 Mar. 21, 2024

(30) Foreign Application Priority Data
Nov. 26, 2020 (EP) .................................... 20210025

(51) Int. Cl.
*H01L 23/473* (2006.01)
(52) U.S. Cl.
CPC ................................. *H01L 23/473* (2013.01)

(58) Field of Classification Search
CPC ........................... H01L 23/3672; H01L 23/473
See application file for complete search history.

(56) References Cited

U.S. PATENT DOCUMENTS

| | | | |
|---|---|---|---|
| 5,810,072 A | 9/1998 | Rees et al. | |
| 6,400,012 B1 | 6/2002 | Miller et al. | |
| 11,525,638 B2* | 12/2022 | Vanderwees | F28F 3/025 |
| 11,976,894 B2* | 5/2024 | Vanderwees | H05K 7/20254 |

(Continued)

FOREIGN PATENT DOCUMENTS

| CN | 108701688 A | 10/2018 |
|---|---|---|
| CN | 111653529 A | 9/2020 |

(Continued)

*Primary Examiner* — Evren Seven
(74) *Attorney, Agent, or Firm* — Procopio, Cory, Hargreaves & Savitch LLP

(57) ABSTRACT

A power semiconductor component with power semiconductor modules connected to a cooling structure, and a cooling chamber having an inlet and outlet port, and adapted for a flow direction of a coolant substance from the inlet port to the outlet port, each of the cooling structures provided within the cooling chamber consecutively in the flow direction forming a flow resistance region in the cooling chamber, the cooling chamber comprises a bypass region connected in parallel to at least one of the flow resistance regions being closer to the inlet port, and is adapted for a flow rate of the at least one flow resistance region, which is connected in parallel to the bypass region, closer to the inlet port being smaller than a flow rate of one of the at least two flow resistance regions closer to the outlet port.

15 Claims, 2 Drawing Sheets

(56) References Cited

U.S. PATENT DOCUMENTS

Figure 1:
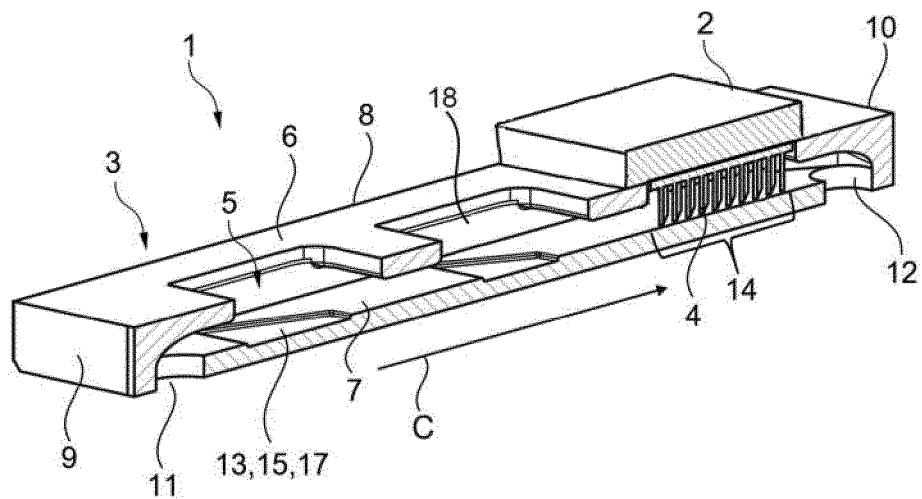

| | | | |
|---|---|---|---|
| 2014/0138075 A1 | 5/2014 | Yang et al. | |
| 2014/0347818 A1* | 11/2014 | Uhlemann | ......... H05K 7/20927 |
| | | | 361/699 |
| 2018/0024599 A1 | 1/2018 | Sakata et al. | |
| 2018/0286781 A1 | 10/2018 | Yoshihara et al. | |

FOREIGN PATENT DOCUMENTS

| | | |
|---|---|---|
| DE | 102013209719 A1 | 11/2014 |
| EP | 2824703 A1 | 1/2015 |
| JP | 2004-080856 A2 | 3/2004 |
| JP | 2009-092357 A | 4/2009 |
| JP | 2013-197159 A | 9/2013 |
| JP | 2016-062919 A | 4/2016 |
| WO | 2005041627 A2 | 5/2005 |
| WO | 2015025582 A1 | 2/2015 |
| WO | 2017/094370 A1 | 6/2017 |

* cited by examiner

POWER SEMICONDUCTOR COMPONENT

CROSS-REFERENCE TO RELATED APPLICATIONS

This application is US National Stage of International Patent Application PCT/EP2021/082840, filed Nov. 24, 2021, which claims priority to European Patent Application No. 20210025.1, filed on Nov. 26, 2020, the contents of which is incorporated herein by reference.

The invention relates to a power semiconductor component.

A critical issue in power electronics business is, for example, cooling of multiple power semiconductor modules. The way of cooling has a considerable impact on the current rating per chip of a power semiconductor module, and therefore, on the number of chips needed to achieve a certain power. If more than one power semiconductor module is used, the power semiconductor modules can be cooled down in a serial configuration. However, in such a serial configuration, a temperature of a coolant increases from an inlet port to an outlet port of a cooling chamber. Thus, the last semiconductor module closer to the outlet port is not cooled down as effectively as the first power semiconductor module closer to the inlet port. In addition, it is possible that a power semiconductor module closer to the inlet port is overcooled within such an arrangement.

It is an object of the invention to provide a power semiconductor component having an improved reliability.

The object is achieved by the subject-matter of the independent claim. Further exemplary embodiments are evident from the dependent claims and the following description.

A first aspect of the invention relates to a power semiconductor component. The term "power" here and in the following, for example, refers to power semiconductor components, power semiconductor modules and/or power semiconductor chips adapted for processing voltages and currents of more than 100 V and/or more than 10 A, exemplary voltages up to 1200 V and current of several hundred amperes.

The power semiconductor component has, for example, a main plane of extension. Lateral directions are aligned parallel to the main plane of extension and a vertical direction is aligned perpendicular to the main plane of extension.

According to an embodiment of the invention, the power semiconductor component comprises at least two power semiconductor modules, each being connected to a cooling structure. For example, each power semiconductor module comprises a bottom surface on which a cooling structure is arranged.

Each power semiconductor module is, for example, in direct contact to the cooling structure. Alternatively, a bond layer is arranged between each power semiconductor module and the cooling structure. The cooling structures are configured, for example, to increase an area of the bottom surface of the power semiconductor modules. The cooling structures are configured, exemplarily, to cool the power semiconductor modules during operation. The cooling structures comprise or consist, for example, of copper.

Exemplarily, the cooling structures are formed from pin fins. For example, the pin fins are facing away from the power semiconductor modules. Each pin fin is formed from a pillar extending in vertical direction. For example, all of the pin fins have a common direction of extension being parallel to the vertical direction.

Alternatively, the cooling structures are formed from lamellas. Each lamella extends in vertical direction having a tip facing away from the power semiconductor module. Further, each lamella of one of the power semiconductor modules extends in lateral direction over a width or a length of the power semiconductor module.

According to the embodiment, the power semiconductor component comprises a cooling chamber having an inlet port and an outlet port. For example, the cooling chamber comprises a cover, at least two sidewalls, a front, a back and a bottom forming a cooling cavity. The at least two sidewalls are connected in lateral directions, for example, via the front and the back. The cover and the bottom are connected in vertical direction, for example, via the at least two sidewalls, the front and the back.

Exemplarily, the front is provided with the inlet port and the back is provided with the outlet port. Alternatively, the bottom is provided with the inlet port and the outlet port. For example, in a region close to the front, the bottom is provided with the inlet port and in a region close to the back, the bottom is provided with the outlet port.

According to the embodiment of the power semiconductor component, the cooling chamber is adapted for a flow direction of a coolant substance within the cooling chamber from the inlet port to the outlet port. For example, the cooling chamber, e.g., the cooling cavity, is configured such that a coolant substance can flow through the cooling chamber from the inlet port to the outlet port.

The flow direction of the coolant substance is, for example parallel to a main extension direction of the cooling chamber, i.e., along a main extension direction of the sidewalls, the cover and the bottom.

Exemplarily, the cooling substance is pumped from the inlet port through the cooling cavity to the outlet port. The cooling substance is, for example, a liquid coolant or a gas coolant. Exemplarily, heat generated during operation of the power semiconductor modules can be dissipated away via the cooling substance effectively.

According to the embodiment of the power semiconductor component, each of the at least two cooling structures are formed within the cooling chamber consecutively in direction of the flow direction such that each of the at least two cooling structures forms a flow resistance region in the cooling chamber. Each cooling structure is configured, exemplarily, to form a flow resistance for the cooling substance flowing from the inlet port to the outlet port. This is to say that each cooling structure associated to one power semiconductor module forms one flow resistance region. Exemplarily, a flow resistance of a flow resistant region is higher than a flow resistance between two consecutive flow resistance regions.

According to the embodiment of the power semiconductor component, the cooling chamber comprises at least one bypass region. For example, the bypass region is free of any cooling structures. Exemplarily, the flow resistance of a bypass region is smaller than the flow resistance of the flow resistance regions.

According to the embodiment of a power semiconductor component, the at least one bypass region is connected in parallel to at least one of the at least two flow resistance regions being closer to the inlet port. For example, the bypass region is connected in parallel to the flow resistance region being closest to the inlet port.

Exemplarily, the bypass region connected in parallel to the flow resistance region is arranged in direct contact to the flow resistance region. This is to say that between the bypass region and the flow resistance region no additional element is arranged, for example.

According to the embodiment of the power semiconductor component, the cooling chamber is adapted for a flow rate of the at least one flow resistance region, which is connected in parallel to the at least one bypass region, closer to the inlet port being smaller than the flow rate of one of the at least two flow resistance regions closer to the outlet port.

In summary, such a power semiconductor component having a bypass region can provide, inter alia, the following advantages. Exemplarily, the power semiconductor modules being arranged along the flow direction can be cooled down effectively. Further, an overcooling of the power semiconductor modules close to the inlet port can be avoided, for example. In addition, a temperature distribution across all of the power semiconductor modules is more equalized than without the bypass.

Moreover, due to such a bypass region a flow resistance of the whole power semiconductor component is reduced, for example, leading to a modified operation point of a pump of the coolant substance. This is to say that a higher flow rate through the cooling chamber can be achieved. Thus, a higher current rating of the power semiconductor modules can be increased without any modification of the design of the power semiconductor modules. This is exemplarily translated into a longer lifetime and thus a better reliability of the power semiconductor component without being more expensive.

Further, it is conceivable that at least two power semiconductor components are arranged adjacent to one another such that the flow directions are parallel. In such an arrangement, the inlet port is a common inlet port and the outlet port is common outlet port for the two power semiconductor components.

According to at least one embodiment of the power semiconductor component, the at least one bypass region connected to at least one of the at least two flow resistance regions is interconnected by at least one intermediate region to one of the at least two flow resistance regions closer to the outlet port. For example, the intermediate region is free of any additional structures, e.g. cooling structures, within the cooling cavity. For example, the intermediate region is configured such that a velocity through a cross-section of the intermediate region perpendicular to the flow direction is substantially constant at any point of the cross section. Substantially constant means here that the velocity does not deviate from an average value of at most 10%.

The coolant substance leaving the bypass region and the associated flow resistance region, for example, are intermixed within the intermediate region. This exemplarily leads to a temperature decrease of the coolant substance leaving the flow resistance region associated to the bypass.

According to at least one embodiment of the power semiconductor component, the cooling chamber comprise at least one opening.

According to at least one embodiment of the power semiconductor component, one of the at least two cooling structures protrudes through the at least one opening into the cooling chamber and the other of the at least two cooling structures are formed integrally with the cooling chamber.

According to at least one embodiment of the power semiconductor component, the cooling chamber comprises at least two openings. For example, the opening, exemplarily each of the openings, is provided within the cover of the cooling chamber. Exemplarily, each opening penetrates the cover of the cooling chamber completely.

According to at least one embodiment of the power semiconductor component, the at least two openings are arranged in the cooling chamber consecutively in the direction of the flow direction. For example, the openings are spaced apart from one another in lateral directions, e.g., along the flow direction.

According to at least one embodiment of the power semiconductor component, each of the at least two cooling structures protrudes through one of the at least two openings into the cooling chamber. Each of the cooling structures protruding through the opening into the cooling chamber forms one of the flow resistance regions.

For example, one of the power semiconductor modules is arranged on one of the openings such that the cooling structures penetrate through the opening of the cooling chamber. Exemplarily, each power semiconductor module has a dimension in lateral directions being at least 5% larger than a dimension in lateral directions of the opening, on which the power semiconductor module is arranged.

According to at least one embodiment of the power semiconductor component, each of the at least two cooling structures are formed integrally with the cooling chamber. Thus, the cooling structures are a part of the cooling chamber. In this case, each semiconductor module is arranged directly and exclusively on the cooling chamber in the region of one of the cooling structures. In this embodiment the cooling chamber is exemplarily formed as a closed cooler.

According to at least one embodiment of the power semiconductor component, the at least one bypass region connected to one of the at least two flow resistance regions is arranged on at least one side surface of the flow resistance region. The side surface of the flow resistance region faces, for example, one of the sidewalls of the cooling chamber. In this embodiment, the bypass region is exemplarily arranged in lateral directions next to the flow resistance region.

For example, the bypass region connected to one of the at least two flow resistance regions is arranged on at least two side surfaces of the flow resistance region. In this case, the bypass region is arranged symmetrically around the flow resistance region in lateral directions along the flow direction.

According to at least one embodiment of the power semiconductor component, the at least one bypass region connected to one of the at least two flow resistance regions is arranged on a bottom surface of the flow resistance region. The bottom surface of the flow resistance region faces, for example, the bottom of the cooling chamber. In this embodiment, the bypass region is exemplarily arranged in vertical direction below the flow resistance region.

According to at least one embodiment of the power semiconductor component, the at least one bypass region connected to one of the at least two flow resistance regions is arranged on the at least one side surface and on the bottom surface of the flow resistance region.

According to at least one embodiment of the power semiconductor component, the at least one bypass region being arranged on the bottom surface of the flow resistance region comprises a recess within a bottom of the cooling chamber. In this embodiment, the bypass region arranged on the bottom surface of the flow resistance region is exemplarily formed between a main surface of the recess delimited by the bottom of the cooling chamber and the bottom surface of the flow resistance region.

According to at least one embodiment of the power semiconductor component, the at least one bypass region being arranged on the side surface of the flow resistance region comprises a recess within a sidewall of the cooling chamber. In this embodiment, the bypass region arranged on the side surface of the flow resistance region is formed between a main surface of the recess delimited by the sidewall of the cooling chamber and the side surface of the flow resistance region.

For example, due to production tolerances, there is a gap between the cooling structures and the bottom of the cooling chamber. Further, due to production tolerances, there is a gap between the cooling structures and the sidewall of the cooling chamber. However, if the bottom and/or the sidewall does not comprise a recess, those gaps cannot be identified with a bypass. For example, a flow rate of a coolant passing one of the gaps is more than one order of magnitude smaller than a flow rate of a coolant passing the bypass region.

Exemplarily, the bypass region arranged on the bottom surface of the flow resistance region is formed by the recess within the bottom as well as the gap between the recess within the bottom and the bottom surface of the flow resistance region. Alternatively or in addition, the bypass region arranged on the side surface of the flow resistance region is formed by the recess within the sidewall as well as the gap between the recess within the sidewall and the side surface of the flow resistance region.

According to at least one embodiment of the power semiconductor component, the recess within the bottom does not protrude beyond the flow resistance region in flow direction. For example, the recess within the bottom overlaps with the flow resistance region completely in lateral directions. Further, a cross-section of the recess within the bottom in lateral directions is smaller than a cross-section in lateral directions of the flow resistance region.

According to at least one embodiment of the power semiconductor component, a main surface of the recess within the bottom is inclined with respect to a main extension plane of the power semiconductor component. For example, a distance between the main surface of the recess within the bottom and the bottom surface of the flow resistance region decreases in size in flow direction. The distance is decreased in size, for example, linearly or non-linearly.

According to at least one embodiment, the power semiconductor component comprises at least three power semiconductor modules, each being connected to a cooling structure, wherein the cooling chamber comprises at least two bypass regions.

According to at least one embodiment of the power semiconductor component, each of the at least two flow resistance regions being closer to the outlet port are connected in parallel to one of the at least two bypass regions.

According to at least one embodiment of the power semiconductor component, a flow rate of one of the at least two bypass regions closer to the inlet port is larger than a flow rate of one of the at least two bypass regions closer to the outlet port.

According to at least one embodiment of the power semiconductor component, a volume of the recess in the bottom closer to the inlet port is larger than a volume of the recess in the bottom closer to the outlet port. Exemplarily, a volume of the bypass region arranged on the bottom surface of the flow resistance region closer to the inlet port is larger than a volume of the bypass region arranged on the bottom surface of the flow resistance region closer to the outlet port.

According to at least one embodiment of the power semiconductor component, each recess in the bottom comprises a length parallel to the flow direction and the lengths of consecutive recesses within the bottom decrease in flow direction. For example, the length of the recess in the bottom is a minimal expansion of the recess in the bottom of the cooling chamber in lateral directions parallel to the flow direction.

According to at least one embodiment of the power semiconductor component, each recess in the bottom comprises a width perpendicular to the flow direction and the width of each recess in the bottom decreases in flow direction. For example, the width of the recess in the bottom is a minimal expansion of the recess in the bottom of the cooling chamber in lateral directions perpendicular to the flow direction.

Exemplarily, the volume of the recess in the bottom is dependent on at least one of the length and the width of the recess in the bottom. Further, the volume of the bypass region arranged on the bottom surface of the flow resistance region is dependent on at least one of the length and the width of the recess in the bottom.

According to at least one embodiment of the power semiconductor component, a volume of the recess within the sidewall closer to the inlet port is larger than a volume of the recess within the sidewall closer to the outlet port. Exemplarily, a volume of the bypass region arranged on the side surface of the flow resistance region closer to the inlet port is larger than a volume of the bypass region arranged on the side surface of the flow resistance region closer to the outlet port.

According to at least one embodiment of the power semiconductor component, each recess within the sidewall comprises a width perpendicular to the flow direction and the width of each consecutive recess within the sidewall decreases in flow direction. For example, the width of the recess within the sidewall is a minimal expansion between the side surface of the flow resistance region and the recess within the sidewall of the cooling chamber in lateral directions perpendicular to the flow direction.

According to at least one embodiment of the power semiconductor component, each recess within the sidewall comprises a length parallel to the flow direction and the length of each consecutive recess within the sidewall decrease in flow direction. For example, the length of the recess within the sidewall is a minimal expansion of the recess in the sidewall of the cooling chamber in lateral directions along the flow direction.

Exemplarily, the volume of the recess within the sidewall is dependent on at least one of the length and the width of the recess within the sidewall.

It is further possible that the width of one of the recesses within the sidewall decreases in flow direction. E.g. a distance between the main surface of the recess within the sidewall and the side surface of the flow resistance region decreases in size in flow direction. The distance is decreased in size, for example, linearly or non-linearly.

According to at least one embodiment of the power semiconductor component, cross-sections perpendicular to the flow direction of consecutive bypass regions are reduced in flow direction by at least 20%.

According to at least one embodiment of the power semiconductor component, a cross-section perpendicular to the flow direction of each bypass region is at least 5% and at most 50% of a total cross-section perpendicular to the flow direction comprising the bypass region and the flow resistance region.

According to at least one embodiment of the power semiconductor component, each power semiconductor module comprises at least one power semiconductor chip.

For example, each power semiconductor module comprises a plurality of power semiconductor chips. The power semiconductor chips are arranged spaced apart from one another in lateral directions. For example, the power semiconductor chips are arranged on grid points of a regular or non-regular grid. For example, the power semiconductor chips are arranged along rows and columns.

If the power semiconductor module comprises the plurality of power semiconductor chips, the bypass region arranged on the bottom surface of the flow resistance region is, for example, inclined with respect to a main extension plane of the power semiconductor component. Due to such an arrangement, a flow rate within the flow resistance region can be predefined by the distance of the main surface of the recess in the bottom of the cooling chamber and the bottom surface of the flow resistance region. If the distance decreases in flow direction, the flow rate within the flow resistance region increases closer to the outlet port. Thus, also power semiconductor chips, being comprised of one of the power semiconductor modules, arranged closer to the outlet port can be cooled effectively.

For example, the recess within the bottom extends in lateral directions along the flow direction up to a centre of the power semiconductor chip closer to the outlet port. Exemplarily, the recess within the bottom ends at least 1 mm to at least 5 mm before the centre of the power semiconductor chip closer to the outlet port in lateral directions along the flow direction.

The subject-matter of the invention will be explained in more detail in the following with reference to exemplary embodiments which are illustrated in the attached drawings.

Figure 2:
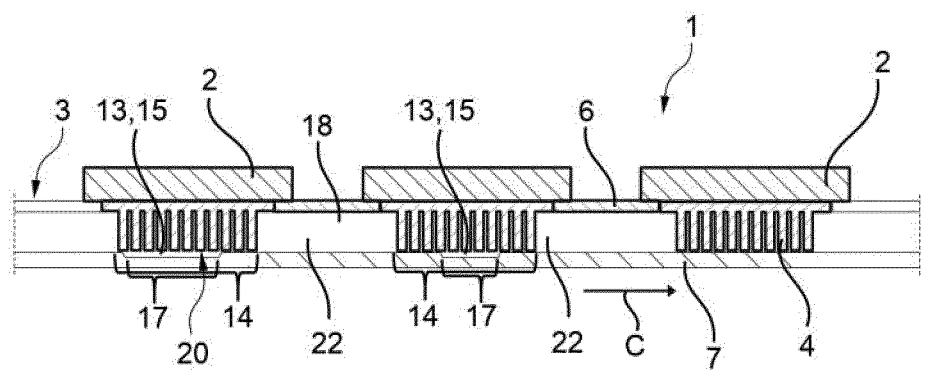

FIGS. 1 and 2 each schematically show a cross-sectional view of a power semiconductor component according to an exemplary embodiment of the invention.

FIGS. 2, 3, 4, 5 and 6 each schematically show a top view of a power semiconductor component according to an exemplary embodiment of the invention.

The reference symbols used in the drawings and their meanings are listed in summary in the list of reference symbols. In principle, identical parts are provided with the same reference symbols in the figures.

The power semiconductor component 1 according to the exemplary embodiment of FIG. 1 comprises a cooling chamber 3. The cooling chamber 3 is formed of a cover 6, two sidewalls 8, a front 9, a back 10 and a bottom 7. These elements form a cooling cavity 18, through which a coolant substance can flow. The bottom 7 of the cooling chamber 3 is provided with an inlet port 11 and an outlet port 12. The inlet port 11 is arranged within the bottom 7 in a region close to the front 9 and the outlet port 12 is arranged in a region close to the back 10.

The cooling chamber 3 is configured such that the coolant substance can flow through the cooling chamber 3 from the inlet port 11 to the outlet port 12. The cooling substance, being a liquid coolant, for example, is pumped from the inlet port 11 through the cooling cavity 18 to the outlet port 12. This is to say that a flow direction of the coolant substance points from the inlet port 11 to the outlet port 12.

Furthermore, the cooling chamber 3 comprises three openings 5 being arranged successively along the flow direction. Here, the openings 5 are provided within the cover 6 of the cooling chamber 3 such that the openings 5 penetrate the cover 6 completely.

On each opening 5, one power semiconductor module 2 is arranged. For a better representability, only one power semiconductor module 2 is shown in FIG. 1. For example, each power semiconductor module 2 has a dimension in lateral directions being larger than a dimension in lateral directions of the associated opening 5.

Each power semiconductor module 2 is provided with a cooling structure 4. In this embodiment, the cooling structures 4 are formed of pin fins, extending in vertical direction. Each cooling structure 4 of each power semiconductor module 2 protrudes through the opening 5, on which the power semiconductor module 2 is arranged. The cooling structure 4 further protrudes into the cooling cavity 18 of the cooling chamber 3.

During operation of the power semiconductor component 1, the coolant substance is pumped in flow direction through the cooling chamber 3. Hereby, each cooling structure 4 impedes an undisturbed flow of the cooling substance, and thus each cooling structure 4 forms a flow resistance region 14 for the cooling substance. Within such a flow resistance region 14, the coolant substance experiences an increased flow resistance compared to regions, where no cooling structures 4 are present.

Furthermore, according to this embodiment, the cooling chamber 3 comprises two bypass regions 17. Here, each of the bypass regions 17 are connected in parallel to the two flow resistance regions 14 being closer to the inlet port 11.

In this embodiment, the bypass regions 17 connected to the flow resistance regions 14 closer to the inlet port 11 are arranged on bottom surfaces 20 of the flow resistance regions 14. The bottom surfaces 20 of the flow resistance regions 14 are marked in connection with FIG. 2. Each bottom surface 20 of the flow resistance regions 14 faces the bottom 7 of the cooling chamber 3. Each bypass region 17 being arranged on the bottom surface 20 of the flow resistance region 14 comprises the recess within the bottom 7 of the cooling chamber 3.

In this embodiment, two recesses 13 are arranged within the bottom 7 of the cooling chamber 3. Each recess 13 is arranged within the bottom 7 below one of the two openings 5 closer to the inlet port 11. Below the opening 5 closer to the outlet port 12, no recess 13 is arranged in the bottom 7.

A volume of the recess within the bottom 15 closer to the inlet port 11 has a volume being larger than a volume of the recess within the bottom 15 closer to the outlet port 12. Thus, the recess within the bottom 15 closer to the inlet port 11 has a flow rate being larger than a flow rate of the recess within the bottom 15 closer to the outlet port 12. Furthermore, a flow rate of the flow resistance region 14, which is connected in parallel to the bypass region 17 closer to the inlet port 11 is smaller than a flow rate of the flow resistance region 14, which is connected in parallel to the bypass region 17 closer to the outlet port 12. In addition, the flow rate of the flow resistance region 14, which is connected in parallel to the bypass region 17 closer to the outlet port 12, is smaller than a flow rate of the flow resistance region 14 not provided with a bypass closer to the outlet port 12.

In connection with FIG. 2, a cross-sectional view along the flow direction, also depicted in FIG. 1, is shown. Here, three power semiconductor modules 2 are shown explicitly.

Each recess within the bottom 15 does not protrude beyond the flow resistance region 14 in flow direction and in lateral directions. Here, each recess within the bottom 15 overlaps with the flow resistance region 14 completely in lateral directions. Further, each length of each recess within the bottom 15 in flow direction is smaller than each length in flow direction of each flow resistance region 14. The volume of each bypass region 17 is, in this embodiment, dependent to each length of the recesses within the bottom 15.

Figure 3:
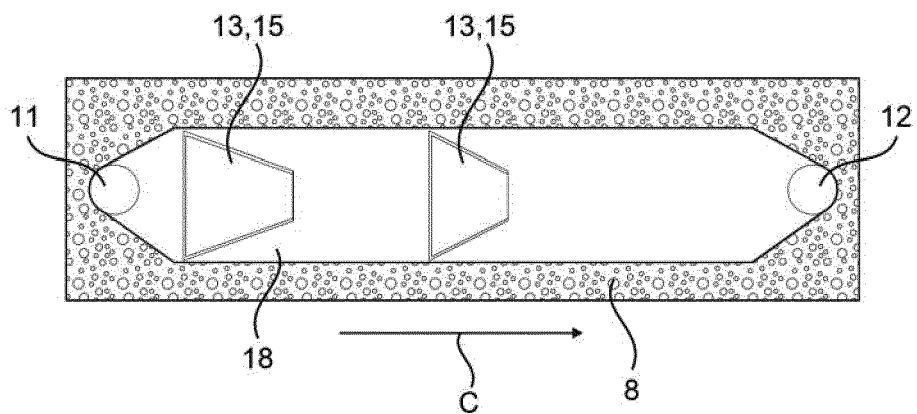

In connection with FIG. 3, the two power semiconductor modules 2 closer to the inlet port 11 are not shown, as in FIG. 1. A recess within the bottom 15 closer to the inlet port 11 has a width perpendicular to the flow direction. Here, the width of each of the recesses in the bottom 15 decreases in flow direction. This is to say that the width of the recess in the bottom 15 closer to the inlet port 11 decreases in flow direction and the width of the recess in the bottom 15 closer to the outlet port 12 decreases in flow direction.

Figure 4:
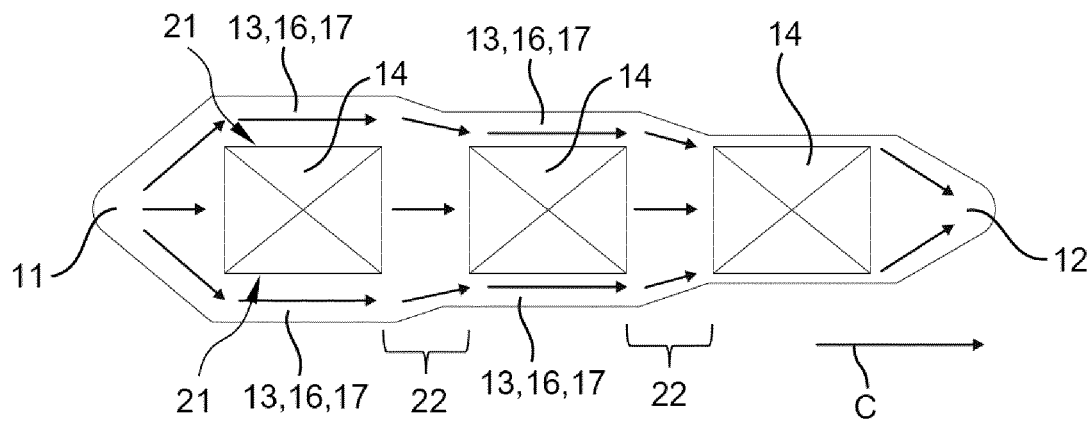

The cooling chamber 3 of the power semiconductor component 1 in connection with FIG. 4 comprises two bypass regions 17, each connected in parallel to one of the flow resistance regions 14. Each bypass region 17 is arranged on two side surfaces 21 of the associated flow resistance regions 14 closer to the inlet port 11. Each side surface 21 of the flow resistance regions 14 faces one of the sidewalls of the cooling chamber 3. In this embodiment, each bypass region 17 is arranged symmetrically around the associated flow resistance region 14 in lateral directions along the flow direction.

The bypass region 17 closer to the inlet port 11 has a width perpendicular to the flow direction being larger than a width perpendicular to the flow direction of the bypass region 17 closer to the outlet port 12.

The flow resistance region 14 closer to the outlet port 12 is not provided with any bypass region.

Directly adjacent flow resistance regions 14 as well as directly adjacent bypass regions 17 are interconnected by an intermediate region 22 to one another.

Figure 5:
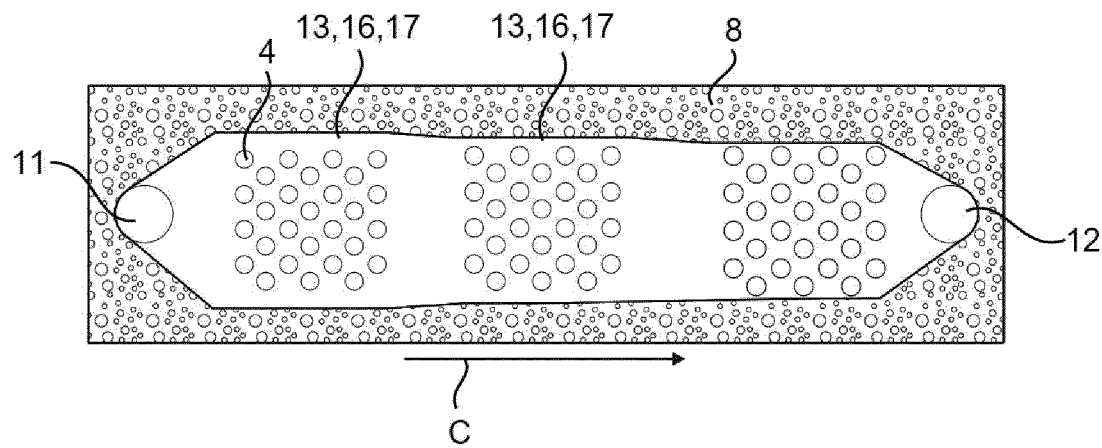

According to FIG. 5, each bypass region 17 arranged on the side surface 21 of the flow resistance region 14 comprises a recess within the sidewall of the cooling chamber 3. Each width of each bypass region 17 declines in flow direction.

Figure 6:
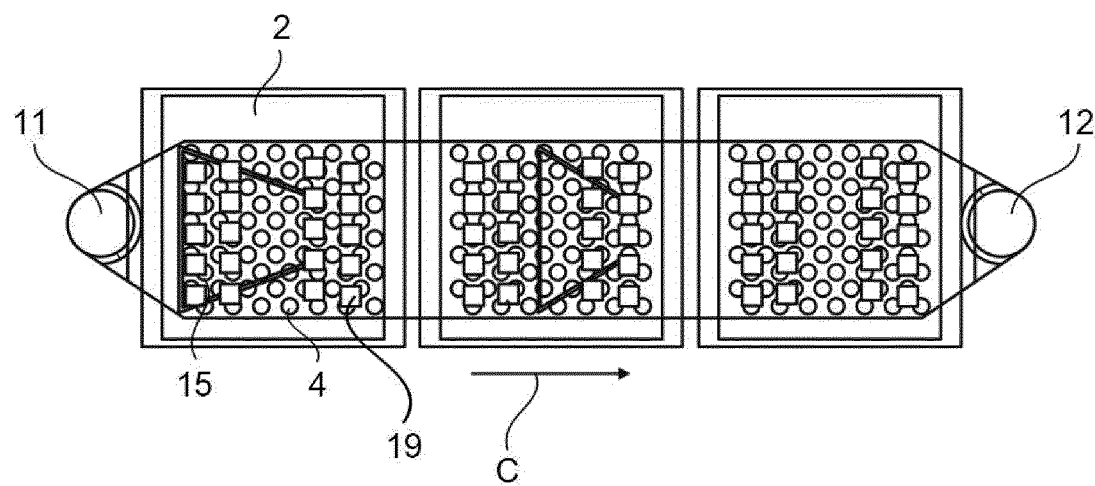

The power semiconductor modules 2 according to FIG. 6 each comprises twenty power semiconductor chips 19. The power semiconductor chips 19 are arranged within the power semiconductor modules along rows and columns.

Due to the shape of the bypass regions 17 arranged on the bottom 7 surface of the flow resistance region 14, the power semiconductor chips 19 closer to the outlet port 12 of one power semiconductor module 2 can be cooled as effective as the power semiconductor chips 19 closer to the inlet port 11 of the same power semiconductor module 2.

REFERENCE SIGNS LIST 1 power semiconductor component
2 power semiconductor module
3 cooling chamber
4 cooling structure
5 opening
6 cover
7 bottom
8 sidewall
9 front
10 back
11 inlet port
12 outlet port
13 recess
14 flow resistance region
15 recess within the bottom
16 recess within the sidewall
17 bypass region
18 cooling cavity
19 power semiconductor chip
20 bottom surface
21 side surface
22 intermediate region
C flow direction

The invention claimed is:

1. A power semiconductor component, with
at least two power semiconductor modules, each being connected to a cooling structure, and
a cooling chamber having an inlet port and an outlet port, wherein
the cooling chamber is adapted for a flow direction of a coolant substance within the cooling chamber from the inlet port to the outlet port,
each of the at least two cooling structures are provided within the cooling chamber consecutively in direction of the flow direction such that each of the at least two cooling structures forms a flow resistance region in the cooling chamber,
the cooling chamber comprises at least one bypass region,
the at least one bypass region is connected in parallel to at least one of the at least two flow resistance regions being closer to the inlet port,
the at least one bypass region has a width perpendicular to the flow direction decreasing in flow direction, and
the cooling chamber is adapted for a flow rate of the at least one flow resistance region, which is connected in parallel to the at least one bypass region, closer to the inlet port being smaller than a flow rate of one of the at least two flow resistance regions closer to the outlet port.

2. The power semiconductor component according to claim 1, wherein the at least one bypass region connected to one of the at least two flow resistance regions is interconnected by at least one intermediate region to one of the at least two flow resistance regions closer to the outlet port.

3. The power semiconductor component according to claim 1, wherein
the cooling chamber comprise at least one opening,
one of the at least two cooling structures protrudes through the at least one opening into the cooling chamber, and
the other of the at least two cooling structures are formed integrally with the cooling chamber.

4. The power semiconductor component according to claim 1, wherein the at least one bypass region connected to one of the at least two flow resistance regions is arranged on at least one side surface of the flow resistance region.

5. The power semiconductor component according to claim 1, wherein the at least one bypass region connected to one of the at least two flow resistance regions is arranged on a bottom surface of the flow resistance region.

6. The power semiconductor component according to claim 1, wherein the at least one bypass region connected to one of the at least two flow resistance regions is arranged on the at least one side surface and on the bottom surface of the flow resistance region.

7. The power semiconductor component according to claim 5, wherein
the at least one bypass region being arranged on the bottom surface of the flow resistance region comprises a recess within a bottom of the cooling chamber, and
the recess within the bottom does not protrude beyond the flow resistance region in the flow direction.

8. The power semiconductor component according to claim 7, wherein a main surface of the recess within the bottom is inclined with respect to a main extension plane of the power semiconductor component.

9. The power semiconductor component according to claim 1, comprising
- at least three power semiconductor modules, each being connected to a cooling structure, wherein
- the cooling chamber comprises at least two bypass regions,
- each of the at least two flow resistance regions being closer to the outlet port are connected in parallel to one of the at least two bypass regions,
- a flow rate of one of the at least two bypass regions closer to the inlet port is larger than a flow rate of one of the at least two bypass regions closer to the outlet port.

10. The power semiconductor component according to claim 7, wherein a volume of the recess within the bottom closer to the inlet port is larger than a volume of the recess within the bottom closer to the outlet port.

11. The power semiconductor component according to claim 9, wherein at least one of
- each recess within the bottom comprises a length parallel to the flow direction and the lengths of consecutive recesses within the bottom decrease in flow direction, and
- each recess within the bottom comprises a width perpendicular to the flow direction and the width of each recess within the bottom decreases in flow direction.

12. The power semiconductor component according to claim 9, wherein
- the at least one bypass region being arranged on the side surface of the flow resistance region is formed as a recess within a sidewall of the cooling chamber, and
- a volume of the recess within the sidewall closer to the inlet port is larger than a volume of the recess within the sidewall closer to the outlet port.

13. The power semiconductor component according to claim 12, wherein at least one of
- each recess within the sidewall comprises a width perpendicular to the flow direction and the width of each consecutive recess within the sidewall decreases in flow direction, and
- each recess within the sidewall comprises a length parallel to the flow direction and the length of each consecutive recess within the sidewall decrease in flow direction.

14. The power semiconductor component according to claim 9, wherein at least one of
- cross sections perpendicular to the flow direction of consecutive bypass regions are reduced in flow direction by at least 20%, and
- a cross section perpendicular to the flow direction of each bypass region is at least 5% and at most 50% of a total cross section perpendicular to the flow direction comprising the bypass region and the flow resistance region.

15. The power semiconductor component according to claim 1, wherein each power semiconductor module comprises at least one power semiconductor chip.

* * * * *